(12) United States Patent
Orlowski et al.

(10) Patent No.: US 7,217,667 B2
(45) Date of Patent: May 15, 2007

(54) PROCESSES FOR FORMING ELECTRONIC DEVICES INCLUDING A SEMICONDUCTOR LAYER

(75) Inventors: Marius K. Orlowski, Austin, TX (US); Victor H. Vartanian, Dripping Springs, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 108 days.

(21) Appl. No.: 11/058,071

(22) Filed: Feb. 15, 2005

(65) Prior Publication Data

US 2006/0183288 A1 Aug. 17, 2006

(51) Int. Cl.
*H01L 21/469* (2006.01)

(52) U.S. Cl. .............. 438/758; 438/766; 438/635; 257/E21.057

(58) Field of Classification Search ......... 438/459, 438/455, 458
See application file for complete search history.

(56) References Cited

U.S. PATENT DOCUMENTS

| | | | | |
|---|---|---|---|---|
| 5,571,734 | A * | 11/1996 | Tseng et al. | 438/591 |
| 5,712,208 | A * | 1/1998 | Tseng et al. | 438/770 |
| 6,191,007 | B1 * | 2/2001 | Matsui et al. | 438/459 |
| 6,369,438 | B1 | 4/2002 | Sugiyama et al. | |

OTHER PUBLICATIONS

Dawon Kahng, "Silicon Integrated Circuits," Academic Press, New York, NY, pp. 68-78, 1981.
K. Sawano, et al., "Relaxation Enhancement of SiGe Thin Layers by Ion Implantation into Si Substrates," 2002 IEEE, Dept. of Applied Physics, School of Engineering, The University of Tokyo, Tokyo, Japan, pp. 403-404.
A.F. Vyatkin, et al., "Ion Beam Induced Strain Relaxation in Pseudomorphous Epitaxial SiGe Layers." 2000 IEEE, Russian Foundation for Basic Research, Project No. 00-02-18039, pp. 70-72.
T. Tezuka, et al., "Fabrication of Strained Si on an Ultrathin SiGe-on-Insulator Virtual Substrate with a High-Ge Fraction," 2001 American Institute of Physics, Advanced LSI Technology Laboratory, Kawasaki, Japan, pp. 1798-1798-1800, Sep. 17, 2001.

* cited by examiner

*Primary Examiner*—Scott B. Geyer
*Assistant Examiner*—Elias Ullah

(57) ABSTRACT

An impurity can be introduced into a semiconductor layer of a workpiece to affect the oxidation and the relative concentration of one element with respect to another element within the semiconductor layer. The impurity can be selectively implanted using one or more masks, manipulating the beam line of an ion implant tool, moving a workpiece relative to the ion beam, or the like. The dose can vary as a function of distance from the center of the workpiece or vary locally based on the design of the electronic device or desires of the electronic device fabricator. In one embodiment, the impurity can be implanted in such a way as to result in a more uniform SiGe condensation across the substrate or across one or more portions of the substrate when the semiconductor layer includes a SiGe layer.

9 Claims, 3 Drawing Sheets

US 7,217,667 B2

PROCESSES FOR FORMING ELECTRONIC DEVICES INCLUDING A SEMICONDUCTOR LAYER

BACKGROUND

1. Field of the Disclosure

The present disclosure relates to processes for forming electronic devices, and more particularly processes for forming electronic devices that include a semiconductor layer.

2. Description of the Related Art

Electronic device substrates, including semiconductor device substrates, continue to increase in size. Currently, nominally 300 mm diameter substrates are used within the semiconductor industry. As device performance increases, device geometries, including thicknesses of layers, decrease. The ratio of wafer diameter to layer thickness increases, controlling some parameters, such as heat, reaction rates, etc., to be uniform across the entire surface of the substrate can be difficult.

FIG. 1 includes an illustration of a cross-sectional view of a workpiece 10 to better illustrate the problem. The workpiece includes a semiconductor device substrate 12, a buried insulating layer 14, and a semiconductor layer 16, which includes SiGe. Each of the buried insulating layer 14 and semiconductor layer 16 are initially formed to a substantially uniform thicknesses across the semiconductor device substrate 12. When performing a germanium condensation operation to enrich the germanium content within the semiconductor layer 16, an oxidation is performed and forms oxide layer 18. The oxidation rate on the wafer is dictated among other things by local mechanical stress and local temperature. Because of the wafer geometry, the heat can be dissipated more readily near the wafer edge. The same holds for the mechanical stress which will be differently distributed in the center than at the edge of the wafer. It is thought that the combination of stress and temperature effects is responsible for the nonuniform growth of oxide on the wafer. For the condensation operation, the thickness of the semiconductor layer 16 is thinner and has a higher concentration of germanium as compared to the semiconductor layer 16 near the edge of the workpiece 10. Such variations are undesired.

Note that the problem is not limited to just a germanium condensation operation. Other processing operations can be affected. Also, other types of electronic substrates, including flat panel display substrates, may experience similar affects during processing.

BRIEF DESCRIPTION OF THE DRAWINGS

The invention is illustrated by way of example and not limitation in the accompanying figures.

Figure 1:
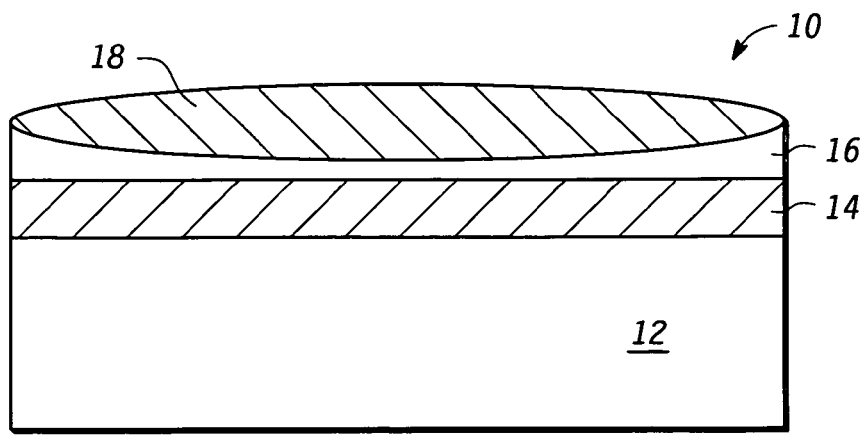
FIG. 1 includes an illustration of a cross-sectional view of a workpiece illustrating a potential non-uniform reaction along a surface of the workpiece. (Prior art)

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

An impurity can be introduced into a semiconductor layer of a workpiece to affect the oxidation and the concentration of the semiconductor layer. The impurity can be selectively implanted using one or more masks, manipulating the beam line of an ion implant tool, moving a workpiece relative to the ion beam or the like. The dose can vary as a function of distance from the center of the workpiece or can vary locally based on the design of the electronic device or desires of the electronic device fabricator. In one embodiment, the impurity can be a halogen, and condensation can be performed such that a germanium content is higher in a particular region of the semiconductor layer (e.g., a SiGe layer) compared to the same region without the impurity. In a particular embodiment, a workpiece with a width or diameter of at least 300 mm (nominal) can be implanted with the impurity in order to achieve a more uniform germanium content within a condensed SiGe layer (i.e., more uniform germanium content across the primary surface of the workpiece).

In one aspect, a process for forming an electronic device includes forming a semiconductor layer over an electronic device substrate, implanting the semiconductor layer with a halogen, and reacting the semiconductor layer with a reactant after implanting the impurity the halogen.

In one embodiment, the semiconductor layer includes at least two different elements selected from the group consisting of C, Si, and Ge. In a particular embodiment, the semiconductor layer includes a substantially monocrystalline SiGe layer. In another embodiment, the halogen includes fluorine or chlorine.

In still another embodiment, as seen from a plan view of the electronic device substrate, the electronic device substrate includes a center, and a density of the impurity changes as a function of a distance from the center. In a particular embodiment, near an edge of the electronic device substrate, implanting is performed to a dose of at least approximately 1E15 ions/cm$^2$. In another particular embodiment, the process further includes forming an implant mask before implanting, wherein during implanting, a region at or near the center receives substantially less of the halogen compared to another region closer to the edge of the electronic device substrate.

In yet another embodiment, the reactant includes an oxidizing species. In a particular embodiment, the reactant includes steam, oxygen, other oxygen-containing species, or any combination thereof, and a halogen-containing species. In a more particular embodiment, reacting is performed at a temperature of at least approximately 940° C. In a further embodiment, the process further includes forming an implant screen layer before implanting the impurity.

In another aspect, a process for forming an electronic device includes implanting an impurity into an electronic device workpiece. As seen from a plan view of the electronic device workpiece, the electronic device workpiece includes a center, and a density of the impurity changes as a function of a distance from the center. The process also includes exposing the electronic device workpiece to heat higher than approximately 30° C.

In one embodiment, the density of the impurity increases as a function of the distance from the center. In another embodiment, implanting is performed such that a first dose is used near the center, wherein the first dose is less than approximately 1E15 ions/cm$^2$, and a second dose is used near an edge of the electronic device substrate, wherein the second dose is at least approximately 1E15 ions/cm$^2$. In still another embodiment, the density of the impurity decreases as a function of the distance from the center. In yet another embodiment, the electronic device workpiece includes a semiconductor layer. Exposing the electronic device workpiece forms a metal-containing silicide layer from at least a portion of the semiconductor layer.

In still another aspect, a process for forming an electronic device includes forming an insulating layer over an electronic device substrate having a center, forming a semiconductor layer including SiGe over the insulating layer, and implanting an impurity into the semiconductor layer. The impurity is a halogen. From a plan view of the electronic device substrate, within the semiconductor layer, an impurity density increases as a function of distance from the center. The process also includes oxidizing the semiconductor layer to form an oxide layer after implanting the impurity. Oxidizing is performed at a temperature of at least approximately 940° C. An ambient used during oxidation includes steam, oxygen, other oxygen-containing species, or any combination thereof, and a halogen-containing species, wherein the oxidizer is at least approximately 50 volume % of the ambient.

In one embodiment, the process further includes removing the oxide layer, wherein after removing the oxide layer, the germanium content within the semiconductor layer is higher after oxidizing compared to the germanium content within the semiconductor layer before oxidizing. In another embodiment, the process further includes forming an implant screen layer over the semiconductor layer before implanting the impurity. In still another embodiment, the halogen-containing species includes a chlorine-containing species.

Before addressing details of embodiments described below, some terms are defined or clarified. Group numbers corresponding to columns within the Periodic Table of the elements use the "New Notation" convention as seen in the *CRC Handbook of Chemistry and Physics*, 81$^{st}$ Edition (2000).

The term "density" is intended to mean an amount of a material per unit area or per unit volume. Areal density is referred to as a dose, and a volume density is referred to as a concentration.

The term "edge" is intended to mean a side of a substrate or workpiece lying between a primary surface (where electronic components are formed) of such substrate or workpiece and a surface opposite the primary surface.

The term "substrate" is intended to mean a base material. An example of a substrate includes a quartz plate, a silicon wafer, a silicon-on-insulator wafer, etc. The reference point for a substrate is the beginning point of a process sequence.

The term "workpiece" is intended to mean a substrate and, if any, one or more layers one or more structures, or any combination thereof attached to the substrate, at any particular point of a process sequence. Note that the substrate may not significantly change during a process sequence, whereas the workpiece significantly changes during the process sequence. For example, at a beginning of a process sequence, the substrate and workpiece are the same. After a layer is formed over the substrate, the substrate has not changed, but now the workpiece includes the combination of the substrate and the layer.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the terms "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

To the extent not described herein, many details regarding specific materials, processing acts, and circuits are conventional and may be found in textbooks and other sources within the semiconductor and microelectronic arts.

Figure 2:
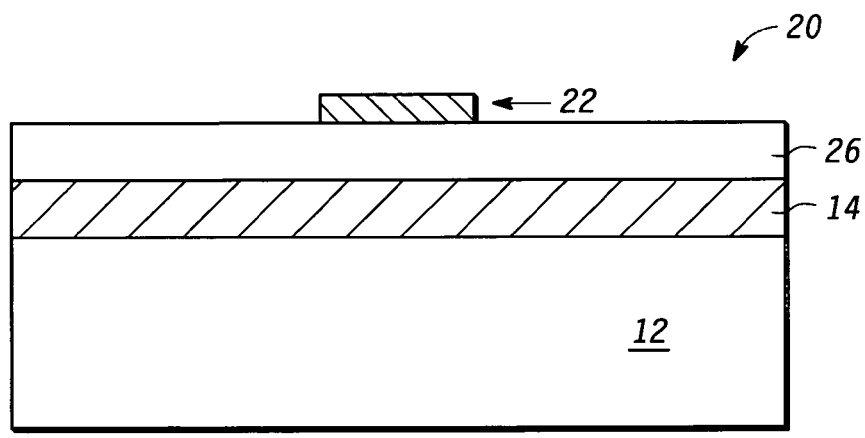
FIG. 2 includes an illustration of a cross-sectional view of a workpiece after forming an implant mask over a semiconductor layer in accordance with one embodiment.

FIG. 2 includes an illustration of a cross-sectional view of an electronic device workpiece 20, which includes a substrate 12, an insulating layer 14, and a semiconductor layer 26. The substrate 12 can include an electronic device substrate, such as a flat panel substrate, a semiconductor device substrate, or the other conventional substrate used for forming electronic devices. In one embodiment, the substrate 12 is a substantially monocrystalline semiconductor material, such as silicon. Clearly, the substrate 12 could include one or more other materials that can be used in place of or in conjunction with silicon. The insulating layer 14 overlies the substrate 12. The insulating layer 14 includes an oxide, nitride, or a combination thereof. The insulating layer 14 (usually referred to as a buried oxide or BOX) has a thickness sufficient to substantially prevent parasitic capacitance between the substrate 12 and subsequently formed electronic devices within the semiconductor layer 26. In one embodiment, the insulating layer 14 has a thickness of at least 100 nm. The semiconductor layer 26 can include one or more C, Si, Ge, or other appropriate material, and in one embodiment, the semiconductor layer 26 consists essentially of substantially monocrystalline SiGe. In one embodiment, the germanium content within the SiGe at this point in the process is in a range of approximately 10 to 20 atomic %, with the rest being substantially only silicon. The semiconductor layer 26 has a thickness sufficient for forming partially or fully depleted semiconductor-on-oxide ("SOI") semiconductor devices. In one embodiment, the semiconductor layer 26 has a thickness in a range of approximately 10 to approximately 40 nm. The formation of the layers 14 and 26 are conventional. In one embodiment, the insulating layer 14 can be formed by thermal growth or deposition, and the semiconductor layer 26 can be formed by deposition. Germanium can be incorporated when the semiconductor layer 26 is formed or may be implanted into a silicon layer. In another embodiment, the initial workpiece 20, as illustrated in FIG. 2) can include a crystalline Si layer (not illustrated) interposed between the insulating layer 14 (e.g., a BOX) and the semiconductor layer 26 (e.g., SiGe layer). Upon a subsequent condensation, a substantial portion of the Si in the SiGe layer is consumed by the oxidation, and the remaining part of SiGe layer together with the Si layer is enriched with Ge to a relatively high level (e.g., approximately 20 to approximately 50%). After reading this specification, skilled artisans will appreciate that other thicknesses and compositions outside the ranges given herein can be used and are not outside the scope of the present invention.

The workpiece 20 will receive an impurity, where the density of the impurity (e.g., amount impurity per unit area (dose) or per unit volume (concentration)) within the semiconductor layer 26 is closer to the edge of the workpiece 20, as compared to the center of the workpiece 20. The difference in density can be achieved in any one or more different ways.

In one embodiment, as illustrated in FIG. 2, an implant mask 22 is formed over the center of the substrate 12. The implant mask 22 may include a resist material, an oxide, a nitride, a metal or metallic alloy, or any combination thereof. The implant mask 22 has a different composition compared to the semiconductor layer 26 to allow the implant mask 22 to be removed preferentially to the semiconductor layer 26. The implant mask 22 is sufficiently thick to substantially prevent a significant portion of ions from passing through the implant mask 22 during ion implantation. The thickness may be based in part on the species to be implanted, the implant energy, and the composition of the implant mask 22. Implant tables typically include projected range ($R_p$) and straggle ($\Delta R_p$) for a given species, energy, and material. In one embodiment, the thickness of the implant mask can be at least $R_p + 3 * \Delta R_p$. In another embodiment, for an inorganic material, the thickness of the implant mask 22 can be at least approximately 100 nm, and for organic material, the thickness of the implant mask 22 can be at least approximately 300 nm. In one particular embodiment, a resist material (e.g., photoresist or deep-ultra violet resist) is coated to a thickness in a range of approximately 500 to approximately 1500 nm and is patterned using a convention technique to form the implant mask 22.

Figure 3:
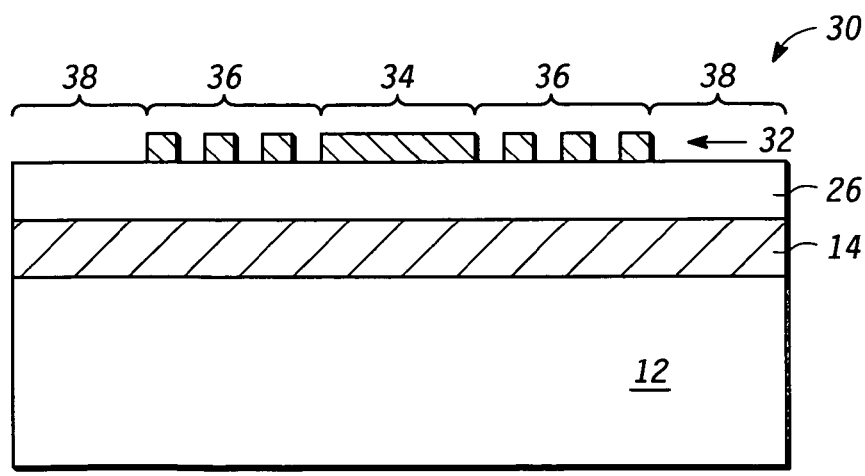
FIGS. 3 and 4 include illustrations of cross-sectional and plan views, respectively, of a workpiece after forming an alternative implant mask over a semiconductor layer in accordance with another embodiment.
Figure 4:
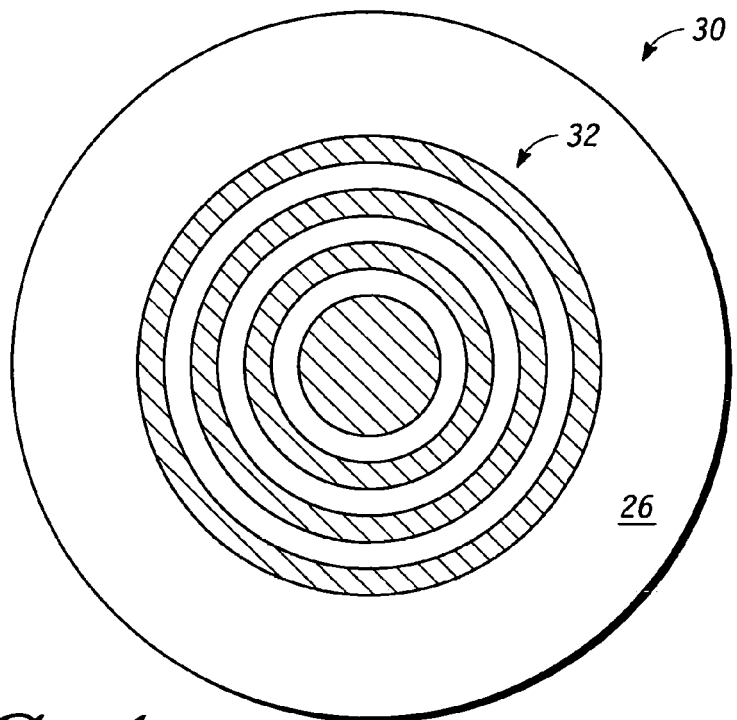

FIGS. 3 and 4 illustrate another embodiment, in which a graded pattern can be used with an implant mask 32 for an electronic device workpiece 30. The implant mask 32 can be formed using any one or more of the materials, thicknesses, techniques, or any combination thereof as described with implant mask 22. A different pattern is formed compared to implant mask 22. The implant mask 32 includes a solid region 34 over the center of the substrate 12, a graded region 36 surrounding the solid region 34, and an exposed region 38 surrounding the graded region 36 and adjacent to the edge of the substrate 12. Substantially no ions will be implanted into the semiconductor layer 26 directly below the solid region 34 during a subsequent ion implant. Substantially all ions reaching the workpiece 30 at region 38 will be implanted into the semiconductor layer 26. Within the graded region 36, substantially no ions will be implanted into regions of the semiconductor layer 26 directly below the implant mask 32, and substantially all ions reaching the workpiece 30 between solid portions of the implant mask 32 will be implanted into the semiconductor layer 26. When averaged over all of the graded region 36, the impurity density of the semiconductor layer 26 within the graded region 36 will be between the concentrations of ions implanted into the regions 34 and 38.

Figure 5:
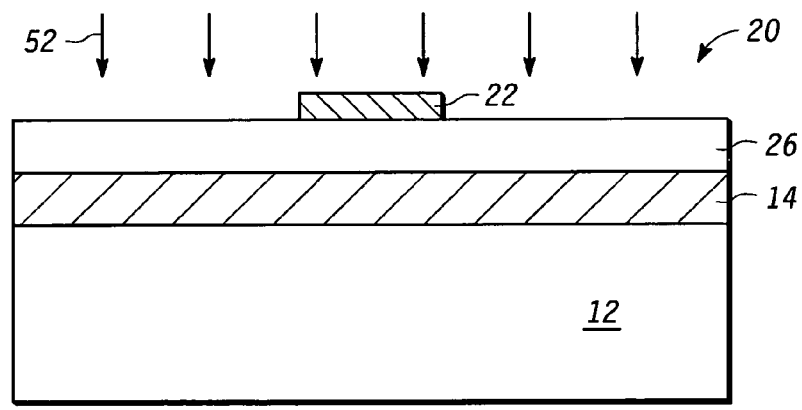
FIG. 5 includes an illustration of cross-sectional view of the workpiece of FIG. 2 during an implanting operation.

The workpiece 20 (previously described with respect to FIG. 2) is implanted with a halogen as illustrated by arrows 52 in FIG. 5. The halogen can include fluorine, chlorine, bromine, or iodine. More specifically, any one or more of $^{19}F^+$, $^{35.5}Cl^+$, $^{80}Br^+$, $^{127}I^+$, or any combination thereof can be ion implanted. In addition, an interhalogen, which a specific example of a halogen, can be implanted. For the purposes of this specification, an interhalogen is a molecule having only halogen atoms, wherein the molecule includes at least two different halogens, such as ClF, $ClF_3$, BrCl, BrF, $BrF_3$, $BrF_5$, IF, $IF_5$, ICl, IBr, or the like.

For the purposes of this specification, a halogen does not include a molecule having an element other than a halogen (e.g., $BF_2^+$).

The energy of the implant may be selected so that the $R_p$ of the implanted species lies within the exposed portions of the semiconductor layer 26. In one embodiment, the energy is in a range of approximately 1 to approximately 30 KeV, and in a particular embodiment is in a range of approximately 10 to approximately 20 KeV. The dose of the implant is at least approximately 1E14 ions/cm$^2$, and in a particular embodiment is at least approximately 1E15 ions/cm$^2$. The resulting concentration of the implanted species within the exposed region of the semiconductor layer 26 is at least approximately 1E19 atoms/cm$^3$, and in a particular embodiment is at least approximately 1E20 atoms/cm$^3$. The region of the semiconductor layer 26 underlying the implant mask 22 receives substantially no implanted species.

After the implant is performed, the implant mask 22 is removed using any one or more conventional techniques. If the implant mask 22 includes a resist material, the implant mask 22 can be removed by ashing.

The workpiece 20 can be placed in a reaction chamber and allowed to react with a reactant. In one embodiment, the reaction is an oxidation, and the reactant includes an oxygen-containing species. The oxygen-containing species is typically at least approximately 50 volume % of the ambient during the reaction and includes $H_2O$, $O_2$, $O_3$, NO, $N_2O$, or a combination thereof. The reacting gas may also include one or more chlorine-containing gases, one or more inert gases, or any combination thereof. The chlorine-containing gas can include any one or more of $Cl_2$, HCl, $C_2HCl_3$, $C_2H_3Cl_3$, or any combination thereof, and the inert gas can include any one or more of He, Ne, Ar, Kr, Xe, or any combination thereof. In one embodiment, the halogen is selected such that it can out-diffuse through the oxide during the oxidation. If a halogen does not out-diffuse, it should not be used. In one particular embodiment, the reaction is performed with approximately 1 to approximately 10 volume % percent HCl with the rest of the ambient being substantially all $H_2O$ or $O_2$. During the reaction, the workpiece 20 is exposed to heat at a temperature higher than approximately 30° C. In one embodiment, the temperature is at least approximately 600° C., and in a particular embodiment is approximately 940° C. or higher. In a more particular embodiment, the temperature is in a range of approximately 1000 to approximately 1200° C. (above the pseudoplastic point of SiO2, approximately 960° C.). The reaction may be performed at substantially atmospheric pressure, higher than atmospheric pressure, or under vacuum. While many reaction parameters have been given, in other embodiments, other gases and temperatures outside those gases and temperature ranges list can be used.

Figure 6:
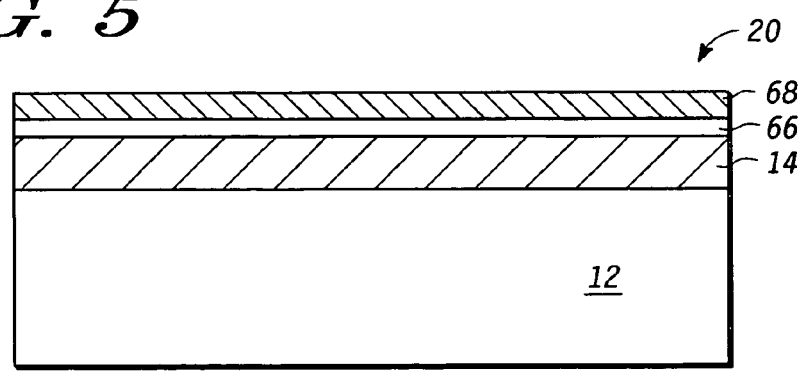
FIG. 6 includes an illustration of cross-sectional view of the workpiece of FIG. 5 after performing a germanium condensation operation.
Figure 7:
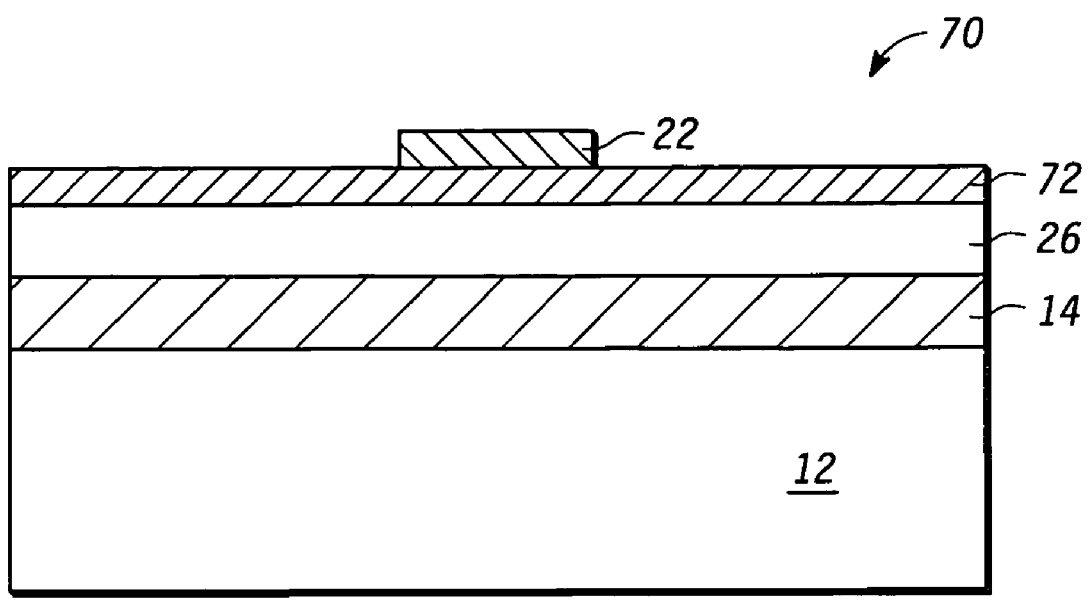
FIG. 7 includes an illustration of cross-sectional view of a workpiece, wherein an implant screen layer is formed prior to an implant mask.

The implanted regions of the semiconductor layer 26 will react, and more specifically, oxidize, at a faster rate than if those same regions of the semiconductor layer 26 were not implanted. The implantation helps to counter the center-to-edge thickness differential as illustrated in FIG. 1. In the specific embodiment with oxidation, the reaction consumes part of the semiconductor layer 26 to form an oxide layer 68 and a condensed semiconductor layer 66 as illustrated in FIG. 6. The silicon within the condensed semiconductor layer 66 reacts more readily with oxygen compared to germanium. Therefore, the oxide layer 68 is mostly silicon dioxide. Most of the germanium remains within the condensed semiconductor layer 66, and therefore, the germanium concentration within the condensed semiconductor layer 66 increases. At the end of the reaction, the condensed semiconductor layer 66 may have a thickness in a range of approximately 10 to 40 nm and the condensed semiconductor thickness has a 1 sigma standard deviation no greater than approximately 1 nm, and in a particular embodiment, the 1 sigma standard deviation is no more than approximately 0.5 nm. As a point of comparison, the standard deviation for the semiconductor layer 16 in FIG. 1 for the same average thickness would be approximately 2 nm. After the reaction, the condensed semiconductor layer 66 is in a range of approximately 30 to approximately 50% of the thickness of the semiconductor layer 26 (before the reaction is performed). In one embodiment, the germanium content within the SiGe at this point in the process is in a range of approximately 20 to approximately 50 atomic %.

After the reaction, the oxide layer 68 is removed using a conventional oxide etchant used for etching $SiO_2$. The workpiece 20 can be processed further to form substantially completed electronic devices. Such processing is conventional and can be used to form doped regions for transistors, resistors, and capacitors within the condensed semiconductor layer 66, and form additional layers over the condensed semiconductor layer 66 for dielectrics, conductors, and the like.

The species being implanted may be relatively small (e.g., $^{19}F^+$). In an alternative embodiment, an implant screen layer 72 may be formed over the semiconductor layer 26 before forming the implant mask 22. When a workpiece 70 is implanted, the implant screen layer 72 allows most of the implanted species to pass through exposed areas of the implant screen layer 72, and reduces the likelihood of implant channeling. The implant screen layer 72 includes an amorphous layer (e.g., oxide, nitride, or a combination thereof) and has a thickness no greater than 20 nm, and in one embodiment, has a thickness in a range of 5 to 15 nm. The implant screen layer 72 may or may not be removed before the germanium condensation operation.

In still another embodiment, an implant mask may not be used when implanting an impurity. By controlling the position of a workpiece including the semiconductor layer 26 within an ion implant tool, the ion beam along a beam line of the ion implant tool, or both, the dose of the implanted species can be varied as a function of distance from the center of the workpiece. In this embodiment, the center of the workpiece may be exposed to the ion beam. However, the ion beam may reside longer over the portion of the workpiece closer to the edge compared to the center, the intensity (e.g. beam current) of the beam may be higher when closer to the edge compared to the center, or both. For example, the ion beam can be controlled by one or more magnets to control rastering of the ion beam to allow more ions to be implanted as desired (e.g., to achieve a heavier dose near the edge of the workpiece as opposed to the center). In another example, an ion implant tool may implant workpieces that are placed onto a disk. The disk may rotate and move in a linear direction (e.g., along a radial direction). The dose can be manipulated by changing the rotational speed, the linear speed, or both. Therefore, the density profile from the center to the edge of the workpiece may increase linearly (straight line or curved line) or as a step-function.

In yet another embodiment, different integrated circuits on the same substrate or even different components (e.g., transistors, resistors, capacitors, etc.) within the same integrated circuit may have different concentrations of germanium within the condensed semiconductor layer 66. Portions of the substrate or integrated circuit would be exposed where the germanium content is to be locally higher and will be masked where the germanium content is to be lower. A halogen implantation and condensation would be performed would be performed as previously described. In another embodiment, the ion implant tool may allow for programming such that different doses of the halogen implantation are used at different regions. Regions that would receive higher implant doses would result in locally thinner regions of condensed semiconductor layer but have higher germanium content, and regions that would receive lower implant doses or no implant at all would result in locally thicker regions of the condensed semiconductor layer but have a lower germanium content. This embodiment may be desirable to enhance hole mobility in one region without degrading electron mobility in other regions. Thus, local differential condensation can be used to allow for locally higher or lower germanium content within the condensed semiconductor layer.

The embodiments described herein can help to locally change a reaction rate by implanting a halogen. The overall thickness of a layer produced from a reaction may be more uniform across the workpiece. The halogen does not act as an n-type or p-type dopant, such as boron, arsenic, phosphorus, or the like. The implanted halogen may potentially increase the oxidation rate similar to HCl in a conventional $O_2$—HCl oxidation by affecting chemical bonds within the semiconductor layer 26 during the post-implant reaction operation. Implanting a species from a noble gas (e.g., $Ar^+$) would not react with the semiconductor layer 26 during the post-implant reaction operation.

While much of the focus has been on an oxidation reaction, the principles may be extended to other reactions. For example, a silicidation reaction (reaction between silicon and a metal or metallic alloy to form a metal-containing silicide) may experience a similar non-uniformity effect. Just like oxidation, the implanted impurity density can change as a function of distance from the center of a substrate. The impurity implanted can be Si, Ge, Ar, etc. The impurity may or may not include a halogen.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining what activities can be used for their specific needs or desires.

In the foregoing specification, principles of the invention have been described above in connection with specific embodiments. However, one of ordinary skill in the art appreciates that one or more modifications or one or more other changes can be made to any one or more of the embodiments without departing from the scope of the invention as set forth in the claims below. Accordingly, the specification and figures are to be regarded in an illustrative rather than a restrictive sense and any and all such modifications and other changes are intended to be included within the scope of invention.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

What is claimed is:

1. A process for forming an electronic device comprising:
    implanting an impurity into an electronic device workpiece, wherein as seen from a plan view of to electronic device workpiece:
        the electronic device workpiece includes a center; and
        a density of the impurity changes as a function of a distance from to center; and
    exposing the electronic device workpiece to heat higher than approximately 30° C.

2. The process of claim 1, wherein the density of the impurity increases as a function of the distance from the center.

3. The process of claim 1, wherein implanting is performed such that
    a first dose is used near the center, wherein the first dose is less than approximately 1E15 ions/cm$^2$; and
    a second dose is used near an edge of the electronic device substrate, wherein the second dose is at least approximately 1B15 ions/cm$^2$.

4. The process of claim 1, wherein the density of the impurity decreases as a function of the distance from the center.

5. The process of claim 1, wherein.
    the electronic device workpiece includes a semiconductor layer, and
    exposing the electronic device workpiece forms a metal-containing silicide layer from at least a portion of the semiconductor layer.

6. A process for forming an electronic device comprising:
    forming an insulating layer over an electronic device substrate having a center;
    forming a semiconductor layer comprising SiGe over the insulating layer;
    implanting an impurity Into the semiconductor layer, wherein:
        the impurity is a halogen; and
        from a plan view of the electronic device substrate, within the semiconductor layer, an impurity density increases as a function of distance from the center; and
    oxidizing the semiconductor layer to form an oxide layer after implanting the impurity, wherein:
        oxidizing is performed at a temperature of at least approximately 940° C.; and
        an ambient used during oxidation comprises steam and a halogen-containing species, wherein the steam is at least approximately 50 volume % of the ambient.

7. The process of claim 6, further comprising removing the oxide layer, wherein after removing the oxide layer, a germanium content within the semiconductor layer is higher after oxidizing compared to the germanium content within the semiconductor layer before oxidizing.

8. The process of claim 6, further comprising forming an implant screen layer over the semiconductor layer before implanting to impurity.

9. The process of claim 6, wherein the halogen-containing species comprises a chlorine-containing species.

* * * * *

UNITED STATES PATENT AND TRADEMARK OFFICE
CERTIFICATE OF CORRECTION

| | | |
|---|---|---|
| PATENT NO. | : 7,217,667 B2 | Page 1 of 1 |
| APPLICATION NO. | : 11/058071 | |
| DATED | : May 15, 2007 | |
| INVENTOR(S) | : Marius K. Orlowski et al. | |

It is certified that error appears in the above-identified patent and that said Letters Patent is hereby corrected as shown below:

Column 9, Line 44, change "1B15" to --1E15--

Column 10, Line 17, change "Into" to --into--

Column 10, Line 40, change "to" to --the--

Signed and Sealed this

Twenty-eighth Day of August, 2007

JON W. DUDAS
*Director of the United States Patent and Trademark Office*